US012796265B2

(12) United States Patent
Eo et al.

(10) Patent No.: US 12,796,265 B2
(45) Date of Patent: Nov. 10, 2026

(54) DISPLAY DEVICE

(71) Applicant: LG Display Co., Ltd., Seoul (KR)

(72) Inventors: Yoonjung Eo, Paju-si (KR); Youngmin Oh, Yeosu-si (KR)

(73) Assignee: LG DISPLAY CO., LTD., Seoul (KR)

(*) Notice: Subject to any disclaimer, the term of this patent is extended or adjusted under 35 U.S.C. 154(b) by 397 days.

(21) Appl. No.: 18/533,961

(22) Filed: Dec. 8, 2023

(65) Prior Publication Data

US 2024/0215365 A1 Jun. 27, 2024

(30) Foreign Application Priority Data

Dec. 26, 2022 (KR) ........................ 10-2022-0184958

(51) Int. Cl.
*H10K 59/35* (2023.01)
*H10K 59/80* (2023.01)

(52) U.S. Cl.
CPC ....... *H10K 59/351* (2023.02); *H10K 59/8793* (2023.02)

(58) Field of Classification Search
CPC ........................................ H10K 59/8791–8793
See application file for complete search history.

(56) References Cited

U.S. PATENT DOCUMENTS

2020/0411609 A1 12/2020 Yonemoto
2021/0408496 A1* 12/2021 Choi .................... H10K 59/121

FOREIGN PATENT DOCUMENTS

JP WO2019/176918 A 9/2019
JP 6888168 B2 6/2021
KR 10-2021-0009229 A 1/2021
KR 10-2021-0079007 A 6/2021
KR 10-2021-0114302 A 9/2021
WO WO-2021020264 A1 * 2/2021 ......... H10K 59/8794

* cited by examiner

*Primary Examiner* — Evan G Clinton
(74) *Attorney, Agent, or Firm* — Birch, Stewart, Kolasch & Birch, LLP

(57) ABSTRACT

Discussed is a display device including a substrate including a plurality of subpixels, each subpixel including an emission area and a non-emission area; a polarization layer disposed on the substrate, and including a first area and a second area having single transmittances; and an organic light emitting element disposed in the emission area, wherein a single transmittance of the second area is higher than a single transmittance of the first area from among the single transmittances.

19 Claims, 17 Drawing Sheets

DISPLAY DEVICE

CROSS-REFERENCE TO RELATED APPLICATIONS

This application claims priority to Korean Patent Application No. 10-2022-0184958, filed in the Republic of Korea on Dec. 26, 2022, the entire contents of which are hereby expressly incorporated by reference into the present application.

BACKGROUND

Field

Embodiments of the present disclosure relate to a display device.

Description of Related Art

Display devices are being widely used in various settings such as in a notebook computer, a tablet computer, a smartphone, a portable display device and a portable information device, in addition to displays of a televisions or a monitor.

Display devices can be classified into a self-luminous display device and a non-self-luminous display device depending on how the display device is able to generate light.

The self-luminous display device is a display device of a type in which a light emitting element or light source is built into the display device and information is displayed using light generated from the built-in light emitting element or light source. The non-self-luminous display device is a display device of a type in which natural light or light emitted from an external lighting such as a backlight unit of the display device is reflected on the display device to display information.

In particular, among various display devices, an organic light emitting diode (OLED) device, being a self-luminous display device, does not require a backlight unit used in a liquid crystal display device (LCD), being a non-self-luminous display device, and thus, a lightweight and a thin shape are possible for the OLED device.

In addition, compared to the liquid crystal display device, the organic light emitting diode device has an excellent viewing angle and contrast ratio, is advantageous in terms of power consumption, is able to be driven with a low DC voltage, has a fast response speed, is resistant to an external shock because internal components are solid, and has a wide operating temperature range.

The contrast of such an organic light emitting diode device greatly decreases depending on the intensity of an external light. In order to prevent this decrease, a polarization layer for blocking a reflection of the external light is attached onto a substrate from which light is emitted.

Attachment of the polarization layer can prevent a decrease in contrast by the external light, but reduces the efficiency of light emitted from the organic light emitting diode device itself to less than half. If a single transmittance of the polarization layer is increased to improve light emission efficiency, a problem arises in that reflectance by the external light increases.

In consideration of this issue, the inventors of the present specification have invented a display device which, by providing different single transmittances for subpixels in a polarization layer of the display device, an increase in reflectance of the display device is minimized and light transmission efficiency is increased.

SUMMARY OF THE DISCLOSURE

Various embodiments of the present disclosure are directed to providing a display device which minimizes an increase in reflectance of the display device and increases light transmission efficiency.

Various embodiments of the present disclosure are directed to providing a display device capable of reducing power consumption and improving the lifespan of a light emitting element.

Various embodiments of the present disclosure are directed to providing a display device capable of low power consumption.

Embodiments of the present disclosure can provide a display device including: a substrate on which a plurality of subpixels each including an emission area and a non-emission area are disposed; a polarization layer disposed on the substrate, and including a first area and a second area having different single transmittances; and an organic light emitting element disposed in the emission area, wherein a single transmittance of the second area is higher than a single transmittance of the first area.

Embodiments of the present disclosure can provide a display device in which the plurality of subpixels include a first subpixel, a second subpixel and a third subpixel which express different colors, the second area is positioned in an emission area of the first subpixel, and the first area is positioned in an area other than the second area.

In the embodiments of the present disclosure, the plurality of subpixels further include a fourth subpixel which expresses a different color from the first to third subpixels.

According to the embodiments of the present disclosure, it is possible to provide a display device which minimizes an increase in reflectance of the display device and increases light transmission efficiency.

According to the embodiments of the present disclosure, by disposing different single transmittances for subpixels in a polarization layer of a display device, it is possible to provide a display device which minimizes an increase in reflectance of the display device and increases light transmission efficiency.

According to the embodiments of the present disclosure, by disposing different single transmittances for subpixels in a polarization layer of a display device, it is possible to provide a display device capable of reducing power consumption and improving the lifespan of a light emitting element.

According to the embodiments of the present disclosure, by disposing different single transmittances for subpixels in a polarization layer of a display device, it is possible to provide a display device capable of low power consumption.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION OF THE EMBODIMENTS

Figure 1:
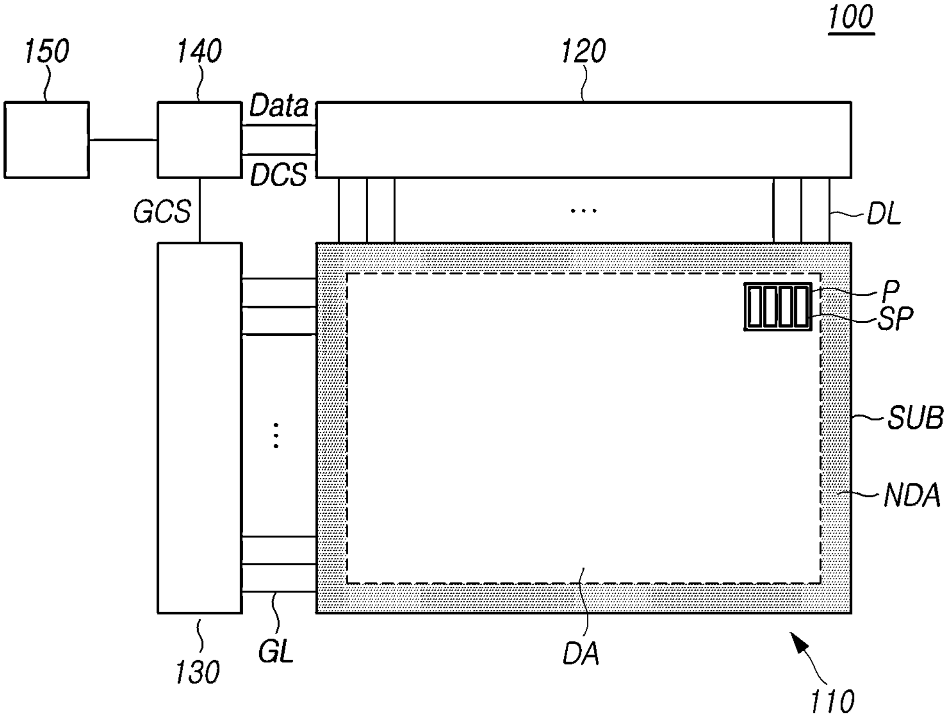
FIG. 1 is a system configuration diagram of a display device in accordance with embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description can make the subject matter in some embodiments of the present disclosure rather unclear. The terms such as “including”, “having”, “containing”, “constituting” “make up of”, and “formed of” used herein are generally intended to allow other components to be added unless the terms are used with the term “only”. As used herein, singular forms are intended to include plural forms unless the context clearly indicates otherwise.

Terms, such as “first”, “second”, “A”, “B”, “(A)”, or “(B)” can be used herein to describe elements of the present disclosure. Each of these terms is not used to define essence, order, sequence, or number of elements etc., but is used merely to distinguish the corresponding element from other elements.

When it is mentioned that a first element “is connected or coupled to”, “contacts or overlaps” etc. a second element, it should be interpreted that, not only can the first element “be directly connected or coupled to” or “directly contact or overlap” the second element, but a third element can also be “interposed” between the first and second elements, or the first and second elements can “be connected or coupled to”, “contact or overlap”, etc. each other via a fourth element. Here, the second element can be included in at least one of two or more elements that “are connected or coupled to”, “contact or overlap”, etc. each other.

When time relative terms, such as “after,” “subsequent to,” “next,” “before,” and the like, are used to describe processes or operations of elements or configurations, or flows or steps in operating, processing, manufacturing methods, these terms can be used to describe non-consecutive or non-sequential processes or operations unless the term “directly” or “immediately” is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term “may” fully encompasses all the meanings of the term “can”.

Hereinafter, various embodiments of the present disclosure will be described in detail with reference to accompanying drawings. All the components of each display device according to all embodiments of the present disclosure are operatively coupled and configured.

FIG. 1 is a system configuration diagram of a display device 100 in accordance with embodiments of the present disclosure.

Referring to FIG. 1, the display device 100 in accordance with the embodiments of the present disclosure can include a display panel 110 and a driving circuit for driving the display panel 110.

The driving circuit can include a data driving circuit 120 and a gate driving circuit 130, and can further include a controller 140 which controls the data driving circuit 120 and the gate driving circuit 130. The controller 140 can convert image data inputted from a host system 150 to provide various data and signals.

The display panel 110 can include a substrate SUB and signal lines such as a plurality of data lines DL and a plurality of gate lines GL disposed on the substrate SUB. The display panel 110 can include a plurality of subpixels SP which are connected to the plurality of data lines DL and the plurality of gate lines GL. The subpixels SP can constitute pixels P, and at least two subpixels SP can constitute one pixel P. For example, as illustrated in FIG. 1, four subpixels SP can constitute one pixel P.

The display panel 110 can include a display area DA where an image is displayed and a non-display area NDA where an image is not displayed. In the display panel 110, the plurality of subpixels SP for displaying an image can be disposed in the display area DA, and, in the non-display area NDA, driving circuits 120, 130 and 140 can be electrically connected or mounted and pad parts to which integrated circuits or printed circuits are connected can be disposed.

The data driving circuit 120 as a circuit for driving the plurality of data lines DL can supply data signals to the plurality of data lines DL. The gate driving circuit 130 as a circuit for driving the plurality of gate lines GL can supply gate signals to the plurality of gate lines GL. In order to control the operation timing of the data driving circuit 120, the controller 140 can supply a data control signal DCS to the data driving circuit 120. The controller 140 can supply a gate control signal GCS for controlling the operation timing of the gate driving circuit 130 to the gate driving circuit 130.

The controller 140 can start a scan according to a timing implemented in each frame, can convert input image data inputted from the outside to be suitable for a data signal format used in the data driving circuit 120 and supply converted image data Data to the data driving circuit 120, and can control driving of data at a proper time corresponding to the scan.

In order to control the gate driving circuit 130, the controller 140 can output various gate control signals GCS including a gate start pulse (GSP), a gate shift clock (GSC), a gate output enable signal (GOE) and so on.

In order to control the data driving circuit 120, the controller 140 can output various data control signals DCS including a source start pulse (SSP), a source sampling clock (SSC), a source output enable signal (SOE) and so on.

The controller 140 can be implemented as a component separate from the data driving circuit 120, or can be implemented as an integrated circuit by being incorporated with the data driving circuit 120.

The data driving circuit 120 receives the image data Data from the controller 140, and supplies data voltages to the plurality of data lines DL, thereby driving the plurality of data lines DL. The data driving circuit 120 is also referred to as a source driving circuit.

Such a data driving circuit 120 can include at least one source driver integrated circuit (SDIC).

For example, each source driver integrated circuit (SDIC) can be connected to the display panel 110 in a tape automated bonding (TAB) method, can be connected to bonding pads of the display panel 110 in a chip-on-glass (COG) or chip-on-panel (COP) method, or can be connected to the display panel 110 by being implemented in a chip-on-film (COF) method.

The gate driving circuit 130 can output a gate signal of a turn-on level voltage or a gate signal of a turn-off level voltage under the control of the controller 140. By sequentially supplying gate signals of a turn-on level voltage to the plurality of gate lines GL, the gate driving circuit 130 can sequentially drive the plurality of gate lines GL.

The gate driving circuit 130 can be connected to the display panel 110 in a tape automated bonding (TAB) method, can be connected to bonding pads of the display panel 110 in a chip-on-glass (COG) or chip-on-panel (COP) method, or can be connected to the display panel 110 according to a chip-on-film (COF) method. Alternatively, the gate driving circuit 130 can be formed in the non-display area NDA of the display panel 110 in a gate-in-panel (GIP) type. The gate driving circuit 130 can be disposed on the substrate SUB or can be connected to the substrate SUB. For example, in the case of the GIP type, the gate driving circuit 130 can be disposed in the non-display area NDA of the substrate SUB. In the case of the chip-on-glass (COG) type or the chip-on-film (COF) type, the gate driving circuit 130 can be connected to the substrate SUB.

At least one driving circuit of the data driving circuit 120 and the gate driving circuit 130 can be disposed in the display area DA. For example, at least one driving circuit of the data driving circuit 120 and the gate driving circuit 130 can be disposed not to overlap with the subpixels SP, or can be disposed to partially or entirely overlap with the subpixels SP.

When a specific gate line GL is opened by the gate driving circuit 130, the data driving circuit 120 can convert image data Data received from the controller 140 into data voltages of an analog form, and can supply the data voltages to the plurality of data lines DL.

The data driving circuit 120 can be connected to one side (e.g., the top side or the bottom side) of the display panel 110. Depending on a driving method, a panel design method, etc., the data driving circuit 120 can be connected to both sides (e.g., the top side and the bottom side) of the display panel 110, or can be connected to at least two sides of the four sides of the display panel 110.

The gate driving circuit 130 can be connected to one side (e.g., the left side or the right side) of the display panel 110. Depending on a driving method, a panel design method, etc., the gate driving circuit 130 can be connected to both sides (e.g., the left side and the right side) of the display panel 110, or can be connected to at least two sides of the four sides of the display panel 110.

The controller 140 can be a timing controller which is used in a typical display technology, can be a control device which includes a timing controller and is capable of further performing other control functions, can be a control device which is different from a timing controller, or can be a circuit in a control device. The controller 140 can be implemented by various circuits or electronic parts such as an integrated circuit (IC), a field programmable gate array (FPGA), an application specific integrated circuit (ASIC) or a processor.

The controller 140 can be mounted on a printed circuit board, a flexible printed circuit board or the like, and can be electrically connected to the data driving circuit 120 and the gate driving circuit 130 through the printed circuit board, the flexible printed circuit board or the like.

The display device 100 in accordance with the embodiments of the present disclosure can be a display such as a liquid crystal display device or the like including a back light unit or a self-luminous display such as an organic light emitting diode (OLED) display, a quantum dot display or a micro light emitting diode (micro LED) display.

When the display device 100 in accordance with the embodiments of the present disclosure is an OLED display, each subpixel SP can include, as a light emitting element, an organic light emitting diode (OLED) which emits light by itself. When the display device 100 in accordance with the embodiments of the present disclosure is a quantum dot display, each subpixel SP can include a light emitting element made of a quantum dot being a semiconductor crystal which emits light by itself. When the display device 100 in accordance with the embodiments of the present disclosure is a micro LED display, each subpixel SP can include, as a light emitting element, a micro light emitting diode (micro LED) which emits light by itself and is made on the basis of an inorganic material.

Figure 2:
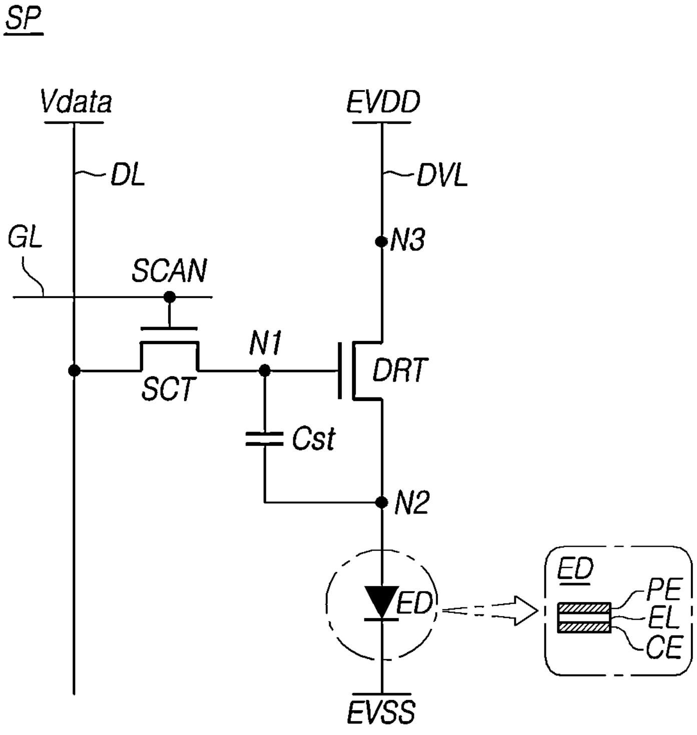
FIG. 2 is an equivalent circuit diagram of a subpixel of the display device in accordance with the embodiments of the present disclosure.

FIG. 2 is an equivalent circuit diagram of the subpixel SP of the display device 100 in accordance with the embodiments of the present disclosure.

Referring to FIG. 2, each of the plurality of subpixels SP disposed in the display panel 110 of the display device 100 in accordance with the embodiments of the present disclosure can include a light emitting element ED, a driving transistor DRT, a scan transistor SCT and a storage capacitor Cst.

Referring to FIG. 2, the light emitting element ED can include a pixel electrode PE and a common electrode CE, and can include a light emitting layer EL which is positioned between the pixel electrode PE and the common electrode CE.

The pixel electrode PE of the light emitting element ED can be an electrode which is disposed in each subpixel SP, and the common electrode CE can be an electrode which is disposed in common in all the subpixels SP. The pixel electrode PE can be an anode electrode, and the common electrode CE can be a cathode electrode. Conversely, the pixel electrode PE can be a cathode electrode, and the common electrode CE can be an anode electrode.

For example, the light emitting element ED can be an organic light emitting diode (OLED), a light emitting diode (LED) or a quantum dot light emitting element.

The driving transistor DRT as a transistor for driving the light emitting element ED can include a first node N1, a second node N2 and a third node N3.

The first node N1 of the driving transistor DRT can be a gate node of the driving transistor DRT, and can be electrically connected to a source node or a drain node of the scan transistor SCT. The second node N2 of the driving transistor DRT can be a source node or a drain node of the driving transistor DRT, and can be electrically connected to the pixel electrode PE of the light emitting element ED. The third node N3 of the driving transistor DRT can be electrically connected to a driving voltage line DVL which supplies a driving voltage EVDD. In some embodiments, a base voltage EVSS can be applied to the common electrode CE of the light emitting element ED. The base voltage EVSS can be, for example, a ground voltage or a voltage similar to the ground voltage.

The scan transistor SCT can be controlled by a scan signal SCAN as a kind of gate signal, and can be connected between the first node N1 of the driving transistor DRT and a data line DL. In other words, the scan transistor SCT can be turned on or off according to the scan signal SCAN supplied from a scan signal line SCL which is a kind of gate line GL, thereby controlling connection between the data line DL and the first nodes N1 of the driving transistor DRT.

The scan transistor SCT can be turned on by the scan signal SCAN having a turn-on level voltage, and thereby, can transfer a data voltage Vdata supplied from the data line DL to the first node N1 of the driving transistor DRT.

When the scan transistor SCT is an n-type transistor, the turn-on level voltage of the scan signal SCAN can be a high level voltage. When the scan transistor SCT is a p-type transistor, the turn-on level voltage of the scan signal SCAN can be a low level voltage.

The storage capacitor Cst can be connected between the first node N1 and the second node N2 of the driving transistor DRT. The storage capacitor Cst is charged with an amount of charge corresponding to a voltage difference between both ends, and serves to maintain the voltage difference between both the ends during a predetermined frame time. Accordingly, during the predetermined frame time, the corresponding subpixel SP can emit light.

The structure of the subpixel SP illustrated in FIG. 2 is only an example, and can be variously modified by further including at least one transistor or at least one capacitor. Each of the plurality of subpixels SP can have the same structure, and some of the plurality of subpixels SP can have a different structure. Each of the driving transistor DRT and the scan transistor SCT can be an n-type transistor or a p-type transistor. Various numbers of transistors and capacitors can be included in each of the plurality of subpixels SP.

The display device 100 in accordance with the embodiments of the present disclosure can have a top emission structure or a bottom emission structure. Hereinbelow, the bottom emission structure will be exemplified. For example, in the case of the bottom emission structure, the anode electrode can be a transparent conductive film, and the cathode electrode can be a reflective metal.

Figure 3:
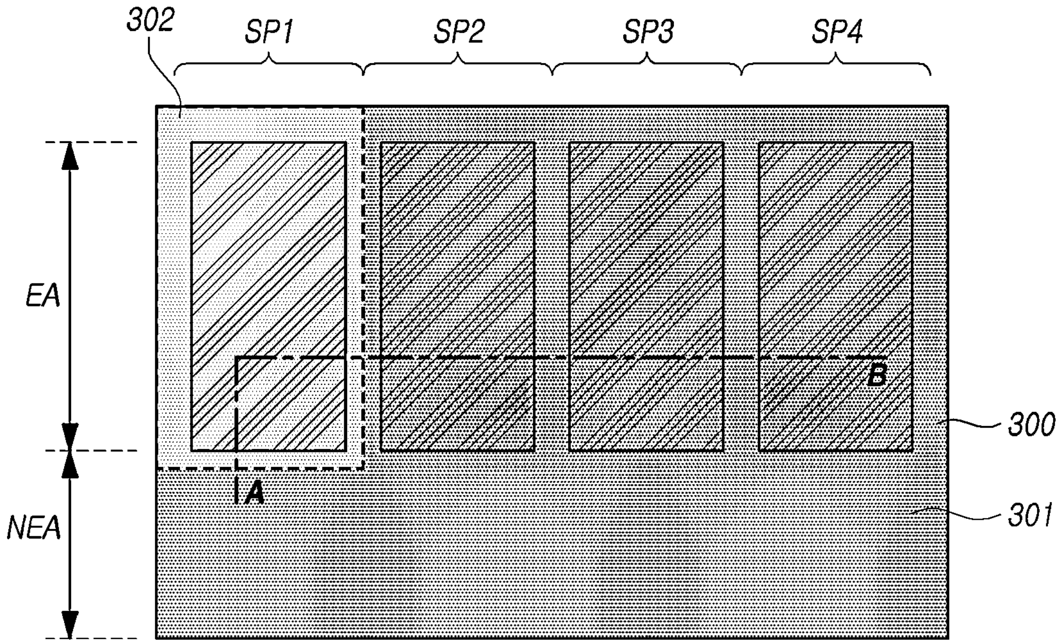
FIG. 3 is a diagram illustrating an example of a layout structure of pixels arranged in a display panel of the display device in accordance with the embodiments of the present disclosure.
Figure 4:
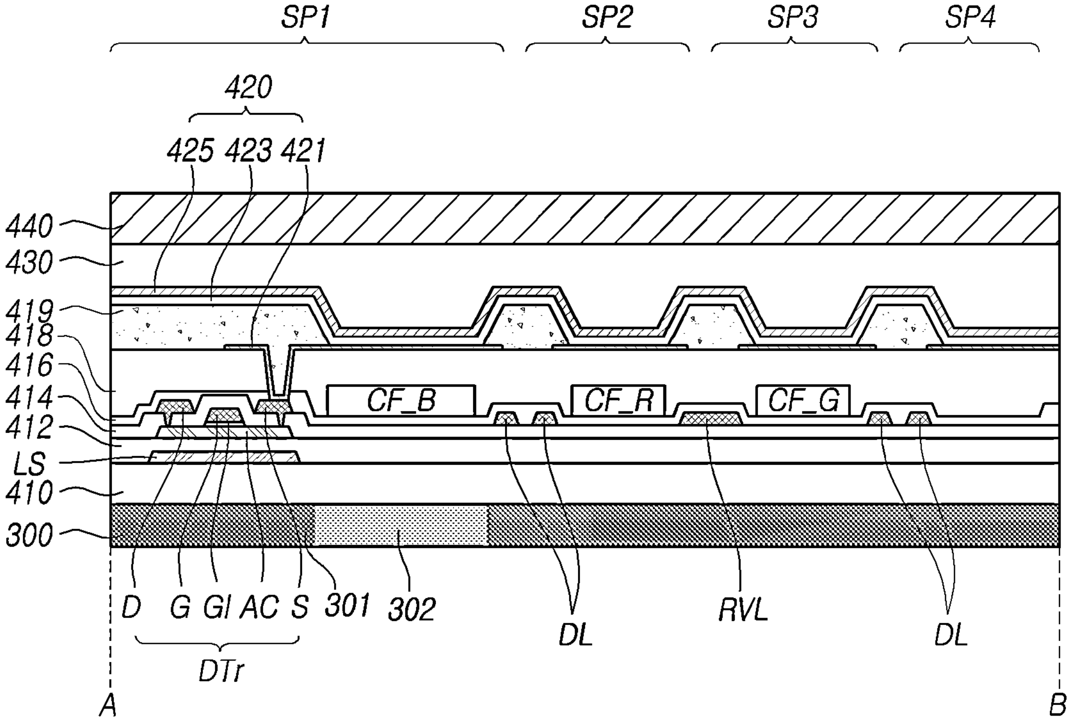
FIG. 4 is a cross-sectional view taken along line A-B of FIG. 3, illustrating a cross-section of subpixels.

FIG. 3 is a diagram illustrating an example of a layout structure of pixels arranged in the display panel of the display device in accordance with the embodiments of the present disclosure, and FIG. 4 is a cross-sectional view taken along line A-B of FIG. 3, illustrating a cross-section of subpixels.

Referring to FIG. 3, the display device 100 in accordance with the embodiments of the present disclosure can include a plurality of subpixels SP1 to SP4, and each of the subpixels SP1 to SP4 can include an emission area EA which emits light for display and a non-emission area NEA other than the emission area EA.

For example, when four subpixels SP constitute one pixel P, a first subpixel SP1 can be a blue subpixel which emits blue light, a second subpixel SP2 can be a red subpixel which emits red light, a third subpixel SP3 can be a green subpixel which emits green light, and a fourth subpixel SP4 can be a white subpixel which emits white light.

When three subpixels SP constitute one pixel P, the fourth subpixel SP4 being a white subpixel can be omitted.

Referring to FIG. 3, the display device 100 in accordance with the embodiments of the present disclosure can include a polarization layer 300 which is positioned to overlap with the respective subpixels SP1 to SP4. For example, the polarization layer 300 can be disposed by being positioned to overlap with the emission area EA and the non-emission area NEA.

Referring to FIG. 3, the polarization layer 300 can include a first area 301 and a second area 302. The second area 302 can be positioned to overlap with the emission area EA, and the first area 301 can be positioned to overlap with an area other than the second area 302.

Referring to FIGS. 3 and 4, in the display device 100 in accordance with the embodiments of the present disclosure, a light shield layer LS, a buffer layer 412, a thin film transistor DTr, an interlayer insulating layer 414, a passivation layer 416, color filter layers CF_B, CF_R and CF_G, a planarization layer 418, a bank 419, a first electrode 421, an organic light emitting layer 423, a second electrode 425, an encapsulation layer 430 and a second substrate 440 can be disposed on a first substrate 410, and the polarization layer 300 can be provided on the outside of the first substrate 410 in a direction in which light is emitted from an organic light emitting element 420.

The light shield layer LS can be disposed on the first substrate 410 to overlap with an active layer AC of the thin film transistor DTr. The light shield layer LS can be formed of a metal such as molybdenum (Mo), aluminum (Al), chromium (Cr) and silver (Ag) or an alloy thereof, but the embodiments of the present disclosure are not limited thereto. The light shield layer LS can block external light from being introduced into the active layer AC of the thin film transistor DTr.

The buffer layer 412 can be defined on the light shield layer LS to cover the light shield layer LS. The buffer layer 412 can be formed by stacking a plurality of inorganic films. For example, the buffer layer 412 can be formed as a multifilm in which one or more inorganic films of a silicon oxide film (SiOx), a silicon nitride film (SiNx) and a silicon oxynitride film (SiON) are stacked. In order to block moisture penetrating into the organic light emitting element 420 through the first substrate 410, the buffer layer 412 can be formed on the entire top surface of the first substrate 410.

The thin film transistor DTr can be disposed on the buffer layer 412. The thin film transistor DTr can include the active layer AC, a gate electrode G, a drain electrode D and a source electrode S. The active layer AC can be disposed on the buffer layer 412 to overlap with the light shield layer LS. The active layer AC can directly contact the source electrode S and the drain electrode D, and can face the gate electrode G with a gate insulating film GI interposed therebetween. The gate insulating film GI can be disposed only between the gate electrode G and the active layer AC, or unlike this, can be disposed on the active layer AC and the buffer layer 412. The gate electrode G can be defined on the gate insulating film GI. The gate electrode G can overlap with the active layer AC with the gate insulating film GI interposed therebetween.

The interlayer insulating layer 414 can be defined on the gate electrode G, the active layer AC and the buffer layer 412. The interlayer insulating layer 414 can perform a function of protecting the thin film transistor DTr, and can insulate the drain electrode D and the source electrode S from the gate electrode G. A partial area of the interlayer insulating layer 414 can be removed to bring the active layer AC into contact with the source electrode S or the drain electrode D. For example, the interlayer insulating layer 414 can include contact holes through which the source electrode S and the drain electrode D pass.

The drain electrode D and the source electrode S can be defined on the interlayer insulating layer 414 to be spaced apart from each other. The drain electrode D can contact one side of the active layer AC through the contact hole defined in the interlayer insulating layer 414, and the source electrode S can contact the other side of the active layer AC through the contact hole defined in the interlayer insulating layer 414.

Although FIG. 4 illustrates that the thin film transistor DTr has a top gate structure, the embodiments of the present disclosure are not limited thereto. The thin film transistor DTr can be formed to have a bottom gate structure or a double gate structure.

The aforementioned signal lines which define subpixel areas can be positioned on the interlayer insulating layer 414. For example, the data lines DL can be positioned between the first subpixel SP1 and the second subpixel SP2 and between the third subpixel SP3 and the fourth subpixel SP4. A reference voltage line RVL can be positioned between the second subpixel SP2 and the third subpixel SP3.

The passivation layer 416 can be defined on the interlayer insulating layer 414 and the thin film transistor DTr. The passivation layer 416 can perform a function of protecting the thin film transistor DTr. The passivation layer 416 can be formed of an inorganic insulating material such as silicon oxide or silicon nitride or an organic insulating material such as photo acryl or benzocyclobutene.

The color filter layers CF_B, CF_R and CF_G can be provided on the passivation layer 416 in the emission area EA. For example, a blue color filter CF_B can be provided in the first subpixel SP1, a red color filter CF-R can be provided in the second subpixel SP2, and a green color filter CF_G can be provided in the third subpixel SP3. Optionally, a color filter may not be provided in the fourth subpixel SP4.

The planarization layer 418 can be defined on the passivation layer 416 and the color filter layers CF_B, CF_R and CF_G to planarize irregularities due to the presence of the thin film transistor DTr and so on. The planarization layer 418 can be formed of an organic insulating material such as photo acryl or benzocyclobutene.

The first electrode 421 which is electrically connected to the source electrode S of the thin film transistor DTr through the planarization layer 418 and the passivation layer 416 can be provided on the planarization layer 418.

The bank 419 can be provided along the edge of the first electrode 421 to define light emitting areas.

The organic light emitting layer 423 and the second electrode 425 can be sequentially provided on the bank 419 and the first electrode 421. The first electrode 421, the organic light emitting layer 423 and the second electrode 425 constitute the organic light emitting element 420. The organic light emitting layer 423 can emit white light.

The encapsulation layer 430 can be defined on the second electrode 425. The encapsulation layer 430 can be formed to surround the organic light emitting element 420. For example, the encapsulation layer 430 can be formed to have a multi-layer structure in which an organic material layer and an inorganic material layer are alternately stacked. The inorganic material layer can serve to block penetration of oxygen or moisture into the organic light emitting element 420. The organic material layer can be formed to have a thickness relatively thicker than the inorganic material layer so as to sufficiently cover particles that can occur during a manufacturing process.

For example, the encapsulation layer 430 can include a first inorganic material layer which surrounds the organic light emitting element 420, an organic material layer which surrounds the first inorganic material layer, and a second inorganic material layer which surrounds the organic material layer. Each of the first and second inorganic material layers can include a material such as silicon nitride, silicon oxide, silicon oxynitride or aluminum oxide. The organic material layer can include any one material of acrylic resin, epoxy resin, phenolic resin, polyamide resin, polyimide resin, benzocyclobutene resin and a fluoro resin, but the embodiments of the present disclosure are not limited thereto.

The polarization layer 300 can be provided on the outside of the first substrate 410. Namely, the polarization layer 300 can be provided on the outside of the first substrate 410 in the direction in which light is emitted from the organic light emitting element 420.

Referring to FIGS. 3 and 4, the polarization layer 300 can include the first area 301 and the second area 302. The second area 302 can be positioned to overlap with the emission area EA, and the first area 301 can be positioned to overlap with the area other than the second area 302.

The polarization layer 300 can have a single transmittance of 40% to 50%. The single transmittance of each of the first area 301 and the second area 302 can be included in the range of the single transmittance of the polarization layer 300.

The first area 301 and the second area 302 can have different single transmittances. For example, the single transmittance of the second area 302 can be higher than the single transmittance of the first area 301. The single transmittance of the second area 302 can be higher by 0.1% or more than the single transmittance of the first area 301. For example, the single transmittance of the second area 302 can be higher by 0.1% or more than the single transmittance of the first area 301, but the single transmittance of the second area 302 may not exceed 50%.

Referring to FIGS. 3 and 4, the second area 302 can be positioned to overlap with the emission area EA of the first subpixel SP1, and the first area 301 can be positioned to overlap with the non-emission area NEA of the first subpixel SP1 and the emission areas EA and the non-emission areas NEA of the second to fourth subpixels SP2 to SP4, but the embodiments of the present disclosure are not limited thereto. In other words, the second area 302 can be positioned to overlap with the emission area EA of any one subpixel of the first to fourth subpixels SP1 to SP4, and the first area 301 can be disposed in a remaining area where the second area 302 is not disposed.

In the display device 100 in accordance with the embodiments of the present disclosure, by disposing the single transmittances of the first area 301 and the second area 302 of the polarization layer 300 to be different from each other, an increase in reflectance of the display device 100 can be minimized, and light transmission efficiency can be improved.

FIGS. 5 to 12 are diagrams illustrating other examples of the layout structure of the pixels arranged in the display panel of the display device in accordance with the embodiments of the present disclosure. For example, FIGS. 5 to 8 illustrate cases where four subpixels constitute one pixel, and FIGS. 9 to 12 illustrate cases where three subpixels constitute one pixel.

Figure 5:
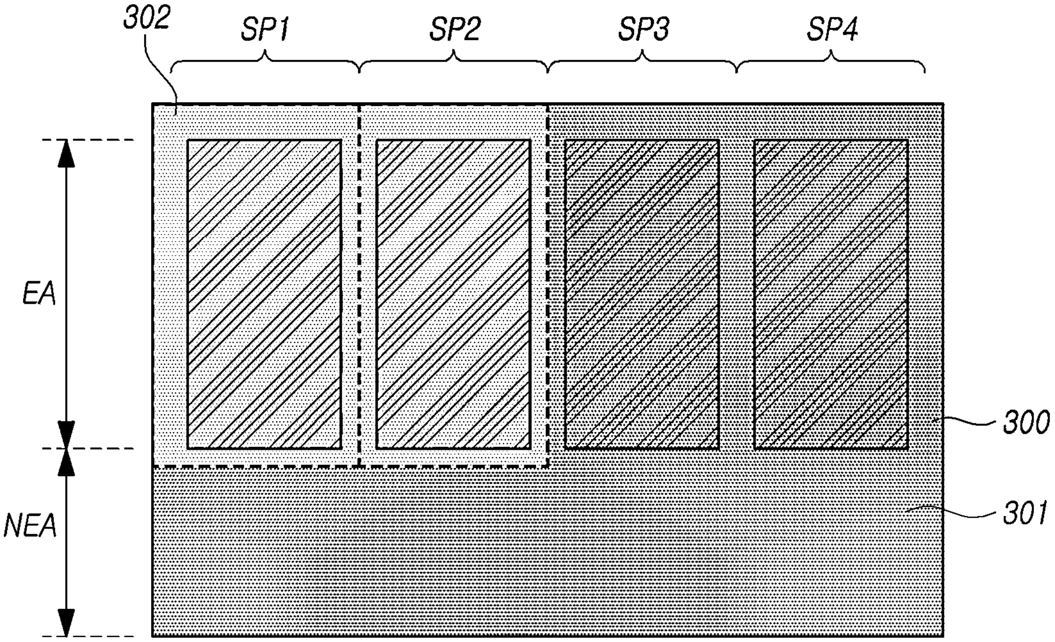
FIGS. 5 to 12 are diagrams illustrating other examples of the layout structure of the pixels arranged in the display panel of the display device in accordance with the embodiments of the present disclosure.
Figure 6:
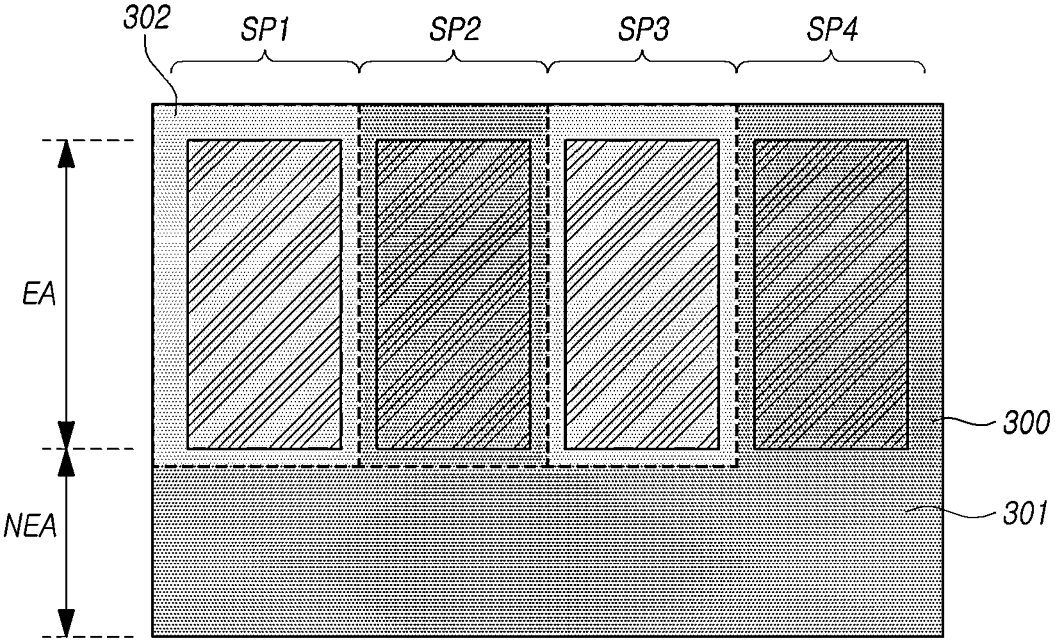

Referring to FIGS. 5 and 6, two emission areas EA and the second area 302 can be positioned to overlap with each other, and the first area 301 can be disposed in a remaining area where the second area 302 is not disposed.

Referring to FIG. 5, the emission areas EA of two adjacent subpixels SP1 and SP2 and the second area 302 can be positioned to overlap with each other, and the first area 301 can be disposed in a remaining area where the second area 302 is not disposed. Alternatively, the second area 302 can be positioned to overlap with the emission areas EA of the second subpixel SP2 and the third subpixel SP3 or the emission areas EA of the third subpixel SP3 and the fourth subpixel SP4, and the first area 301 can be disposed in a remaining area where the second area 302 is not disposed.

Referring to FIG. 6, the emission areas EA of two non-adjacent subpixels SP1 and SP3 and the second area 302 can be positioned to overlap with each other, and the first area 301 can be disposed in a remaining area where the second area 302 is not disposed. Alternatively, the second area 302 can be positioned to overlap with the emission areas EA of the second subpixel SP2 and the fourth subpixel SP4, and the first area 301 can be disposed in a remaining area where the second area 302 is not disposed.

Figure 7:
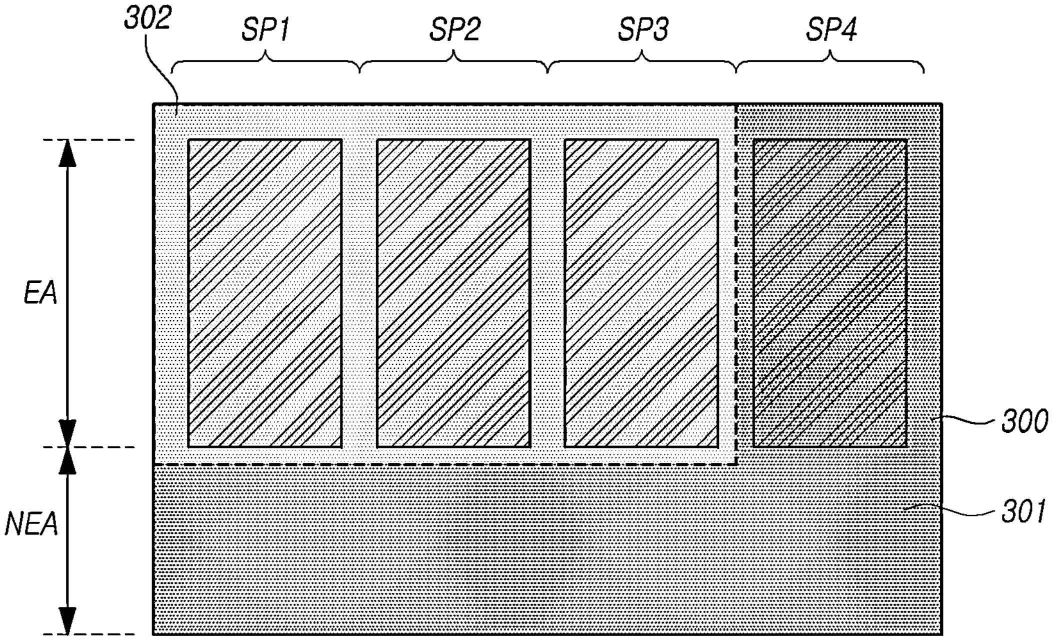

Referring to FIG. 7, the emission areas EA of three adjacent subpixels SP1 to SP3 and the second area 302 can be positioned to overlap with each other, and the first area 301 can be disposed in a remaining area where the second area 302 is not disposed. Alternatively, the second area 302 can be positioned to overlap with the emission areas EA of the second to fourth subpixels SP2 to SP4, and the first area 301 can be disposed in a remaining area where the second area 302 is not disposed. Alternatively, the emission areas EA of two adjacent subpixels SP1 and SP2 and the non-adjacent fourth subpixel SP4 and the second area 302 can be positioned to overlap with each other, and the first area 301 can be disposed in a remaining area where the second area 302 is not disposed.

Figure 8:
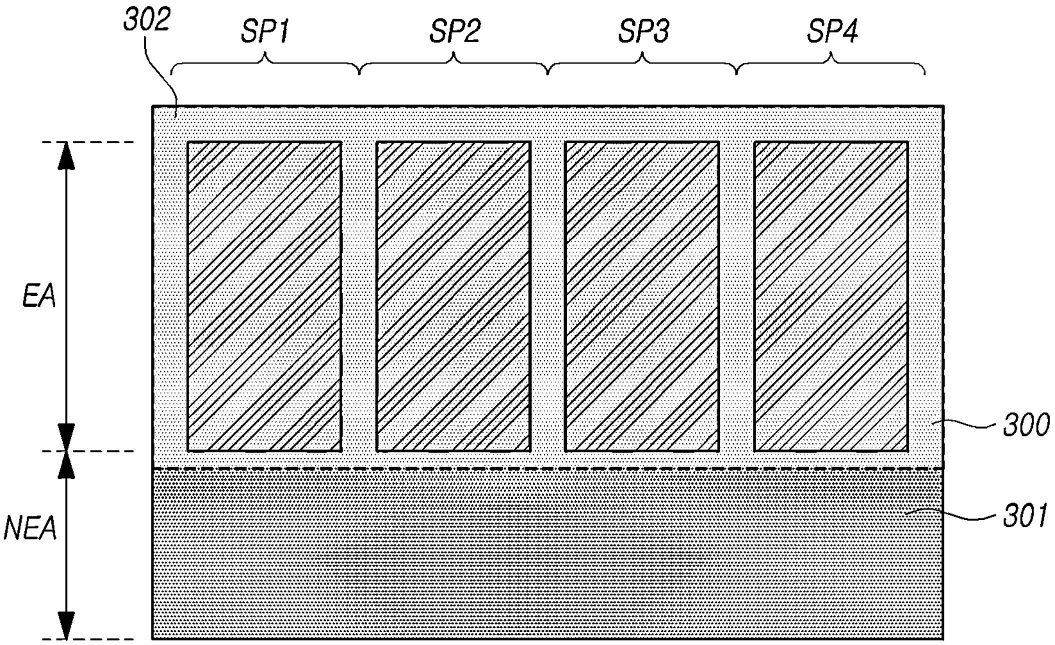

Referring to FIG. 8, the emission areas EA of four subpixels SP1 to SP4 and the second area 302 can be positioned to overlap with each other, and the first area 301 can be disposed in a remaining area where the second area 302 is not disposed. For example, the second area 302 can be positioned in the emission areas EA, and the first area 301 can be positioned in the non-emission areas NEA.

Figure 9:
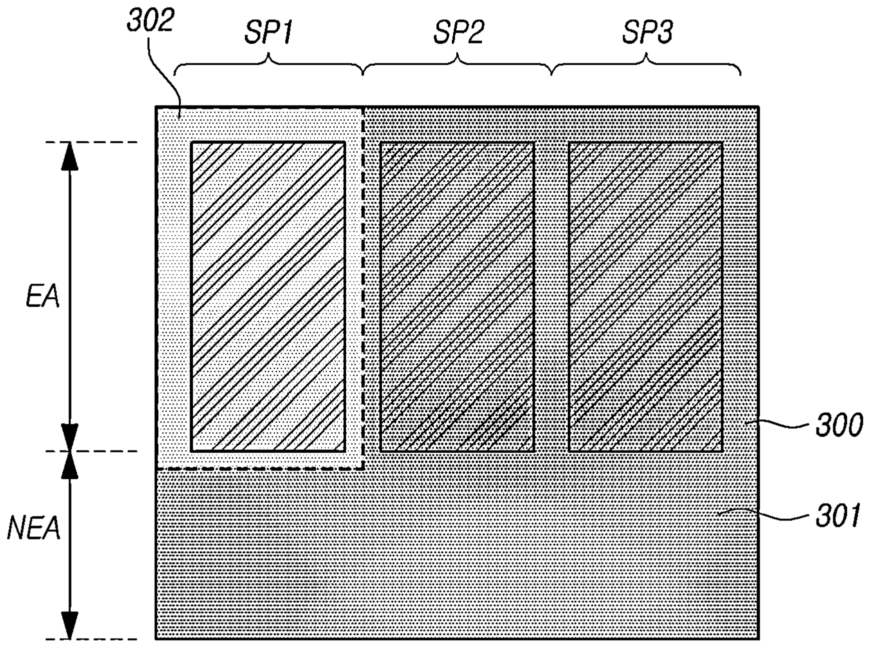

Referring to FIG. 9, the second area 302 can be positioned to overlap with the emission area EA of the first subpixel SP1 among three subpixels SP1 to SP3, and the first area 301 can be positioned to overlap with the non-emission area NEA of the first subpixel SP1 and the emission areas EA and the non-emission areas NEA of the second and third subpixels SP2 and SP3, but the embodiments of the present disclosure are not limited thereto. In other words, the second area 302 can be positioned to overlap with the emission area EA of any one subpixel of the first to third subpixels SP1 to SP3, and the first area 301 can be disposed in a remaining area where the second area 302 is not disposed.

Figure 10:
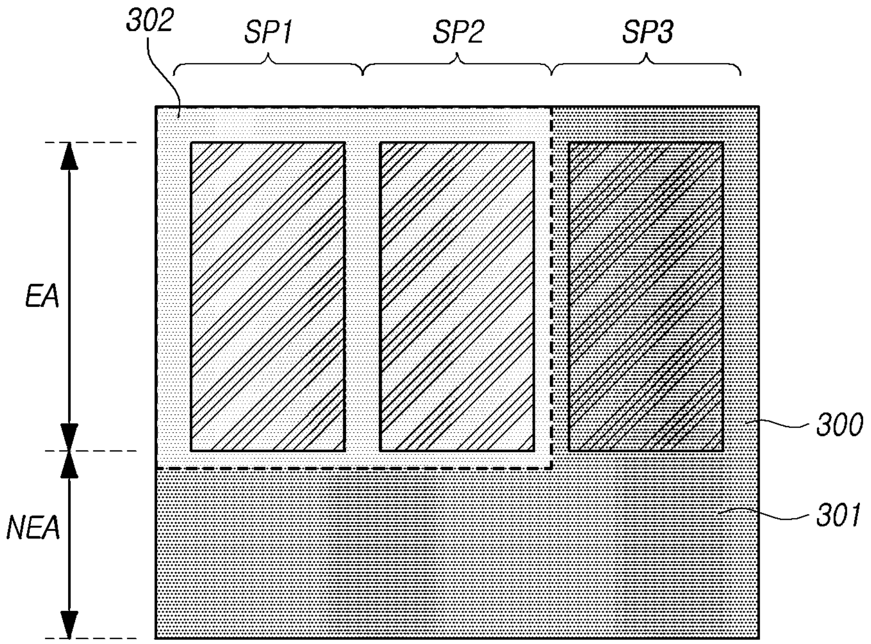
Figure 11:
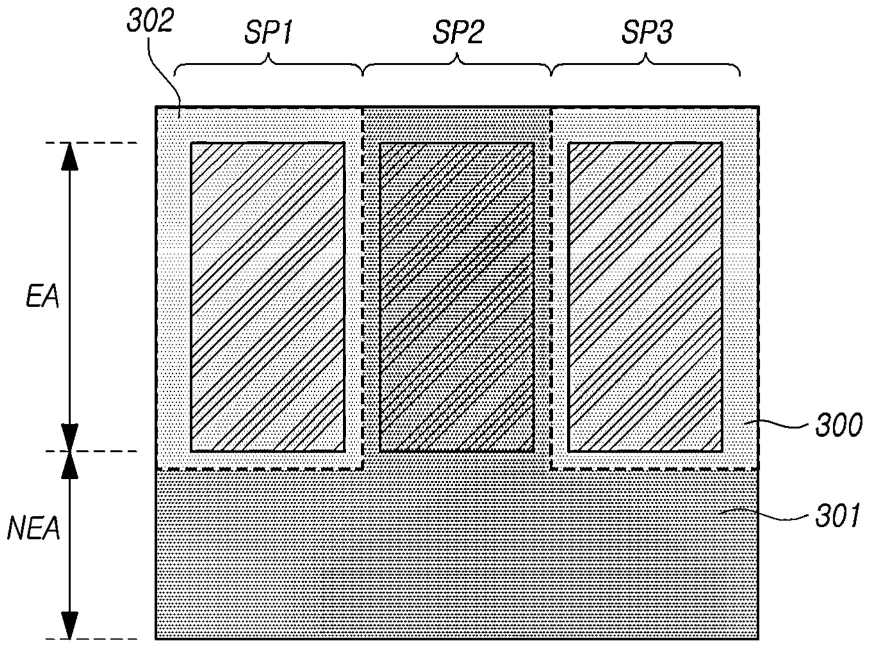

Referring to FIGS. 10 and 11, two emission areas EA and the second area 302 can be positioned to overlap with each other, and the first area 301 can be disposed in a remaining area where the second area 302 is not disposed.

Referring to FIG. 10, the emission areas EA of two adjacent subpixels SP1 and SP2 and the second area 302 can be positioned to overlap with each other, and the first area 301 can be disposed in a remaining area where the second area 302 is not disposed. Alternatively, the second area 302 can be positioned to overlap with the emission areas EA of the second subpixel SP2 and the third subpixel SP3, and the first area 301 can be disposed in a remaining area where the second area 302 is not disposed.

Referring to FIG. 11, the emission areas EA of two non-adjacent subpixels SP1 and SP3 and the second area 302 can be positioned to overlap with each other, and the first area 301 can be disposed in a remaining area where the second area 302 is not disposed.

Figure 12:
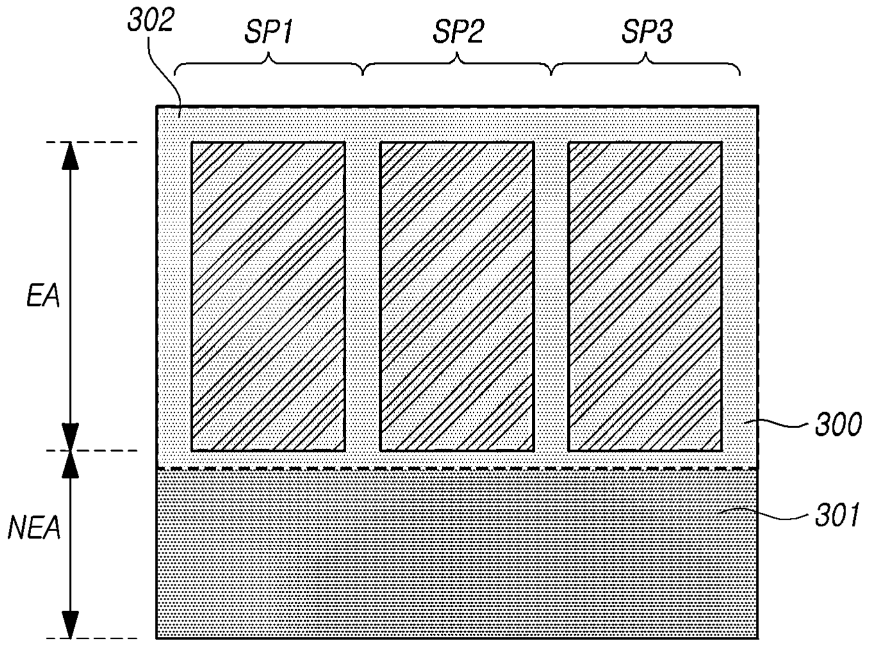

Referring to FIG. 12, the emission areas EA of three subpixels SP1 to SP3 and the second area 302 can be positioned to overlap with each other, and the first area 301 can be disposed in a remaining area where the second area 302 is not disposed. For example, the second area 302 can be positioned in the emission areas EA, and the first area 301 can be positioned in the non-emission areas NEA.

In various embodiments of the present disclosure, as provided in FIGS. 3-12, the second area 302 can be positioned in the emission area EA, and the first area 301 can be positioned in at least one of the emission area EA and the non-emission area NEA. Also, in FIGS. 3-12, the first area 301 in the emission area EA and the second area 301 in the emission area can be provided to overlap the entirety of at least one of the subpixels SP1, SP2, SP3 and SP4. But the embodiments of the present disclosure are not limited thereto. For example, when the first area 301 in the emission area EA overlaps at least one of the subpixels SP1, SP2, SP3 and SP4, the overlap thereof does not need to be the entirety of at least one of the subpixels SP1, SP2, SP3 and SP4, but the overlap can be a partial overlap of a part of the least one of the subpixels SP1, SP2, SP3 and SP4.

As a specific example of a partial overlap of at least one of the subpixels SP1, SP2, SP3 and SP4, the first area 301 can overlap a part of the first subpixel SP1. For example, the overlap of the first subpixel SP1 by the first area 301 can be about half of the area of the first subpixel SP1, but such is not required. When about half of the area of the first subpixel SP1 is overlapped with the first area 301, the other half of the area of the first subpixel SP1 can be overlapped by the second area 302. Similar overlapping arrangements of the first area 301 and the second area 302 can be applied to at least one of the second subpixel SP2, the third subpixel SP3 and the fourth subpixel SP4. The ratio of overlap of the one or more of the subpixels SP1, SP2, SP3 and SP4 by the first area 301 and the second area 302 need not be 50/50, but can range from 0/100 to 100/0, for example. Accordingly, for one or more of the subpixels SP1, SP2, SP3 and SP4, both the first area 301 and the second area 302 can overlap therewith in various amounts.

In embodiments of the present disclosure, the ratio of overlap of the first area 301 and the second area 302 with one or more of the subpixels SP1, SP2, SP3 and SP4 need not be the same for all of the subpixels SP1, SP2, SP3 and SP4. Rather, the ratio of overlap of the first area 301 to the second area 302 in the first subpixel SP1 can be the same or different from that of the second subpixel SP2, which can be the same or different from that of the third subpixel SP3, and which can also be the same or different from that of the fourth subpixel SP4. Accordingly, by way of example, the first area 301 can overlap with 40% of the first subpixel SP1 while the second area 302 can overlap with 60% of the first subpixel. Meanwhile, the first area 301 can overlap with 30% of the second subpixel SP2 while the second area 302 can overlap with 70% of the second subpixel SP3. Meanwhile, the first area 301 can overlap with 65% of the third subpixel SP3 while the second area can overlap with 35% of the third subpixel SP3. Meanwhile, the first area 301 can overlap with 75% of the fourth subpixel SP4 while the second area 302 can overlap with 25% of the fourth subpixel SP4. Accordingly, amounts of overlap with the subpixels SP1, SP2, SP3 and SP4 with the first area 301 and the second area 302 can vary.

In various embodiments of the present disclosure, a location of the second area 302 that overlaps the one or more subpixels SP1, SP2, SP3 and SP4 can be proximal to the non-emission area NEA for each of the one or more subpixels SP1, SP2, SP3 and SP4, but the embodiments of the present disclosure are not limited thereto. For example, the location of the second area 302 that overlaps the one or more subpixels SP1, SP2, SP3 and SP4 can be distal to the non-emission area NEA, so that the location of the first area 301 that overlaps the one or more subpixels SP1, SP2, SP3 and SP4 can be proximal to the non-emission area NEA.

In various embodiments of the present disclosure, each of the one or more subpixels SP1, SP2, SP3 and SP4 can be overlapped with segments of the first area 301 and second area 302. For example, for the first subpixel SP1, the second area 302 can be provided as two or more segments, and the first area 301 that overlaps with the first subpixel SP1 can be interposed between the two segments of the second area 302. In this instance, the two segments of the second area 302 can be arranged either vertically, horizontally or in a third direction in a plan view of FIG. 3, for example. When the two segments of the second area 302 are arranged vertically, the first area 301 that overlaps the first subpixel SP1 can also be arranged vertically, and when the two segments of the second area 302 are arranged horizontally, the first area 301 that overlaps the first subpixel SP1 can also be arranged horizontally. The same goes for the third direction arrangement, as well as for one or more of the subpixels SP2, SP3 and SP4. In other embodiments of the present disclosure, the first area 301 can have segments that interpose the second area 302 for one or more of the subpixels SP1, SP2, SP3 and SP4.

In various embodiments of the present disclosure, such as FIG. 3, a shape of the second area 302 is provided as a polygon (e.g., a rectangle) that corresponds to a shape of the one or more of the subpixels SP1, SP2, SP3 and SP4. But the embodiments of the present disclosure are not limited thereto. For example, the shape of the subpixels SP1, SP2, SP3 and SP4 need not be rectangular, but can be other shapes, including hexagonal, circular, triangular or others. Also, the shape of at least one of the first area 301 and the second area 302 can be different from that of the at least one of subpixels SP1, SP2, SP3 and SP4. For example, the shape of the second area 302 can be polygonal, hexagonal, circular, oval, triangular or others while the shape of the subpixels SP1, SP2, SP3 and SP4 can be rectangular.

In various embodiments of the present disclosure, the second area 302 can be provided in segments or patterns that can be distributed over one or more of the subpixels SP1, SP2, SP3 and SP4. For example, the segments or patterns can be composed of a plurality of individual shapes including a rectangular shape, circular shape, an annular shape or other, and the individual shapes can be collectively arranged into regular or irregular patterns to overlap the one or more of the subpixels SP1, SP2, SP3 and SP4. In this instance, the patterns in the individual subpixels SP1, SP2, SP3 and SP4 can be the same or different.

In embodiments of the present disclosure such as shown in FIGS. 5, 7 and 8 where immediately adjacent subpixels have contiguous second area 302, the second area 302 need not extend uninterrupted from one subpixel to the next subpixel (such as the first subpixel SP1 and the second subpixel SP2 as shown in FIG. 5). For example, a sliver of the first area 301 can be located between the second area 302 of the first subpixel SP1 and the second area 302 of the second subpixel SP2. In embodiments of the present disclosure, the sliver of the first area 301 between the first subpixel SP1 and the second subpixel SP2 can be located to overlap the bank 419 and/or the data line DL.

In the display device in accordance with the embodiments of the present disclosure, by disposing single transmittances of a first area and a second area of a polarization layer to be different from each other for respective subpixels, it is possible to minimize an increase in reflectance of the display device and improve light transmission efficiency.

In the display device in accordance with the embodiments of the present disclosure, by disposing single transmittances of a first area and a second area of a polarization layer to be different from each other for respective subpixels, it is possible to provide a display device capable of reducing power consumption and improving the lifespan of a light emitting element.

In the display device in accordance with the embodiments of the present disclosure, by disposing single transmittances of a first area and a second area of a polarization layer to be different from each other for respective subpixels, it is possible to provide a display device capable of low power consumption.

Hereinafter, a method for manufacturing a polarization layer included in the embodiments of the present disclosure will be described.

Figure 13:
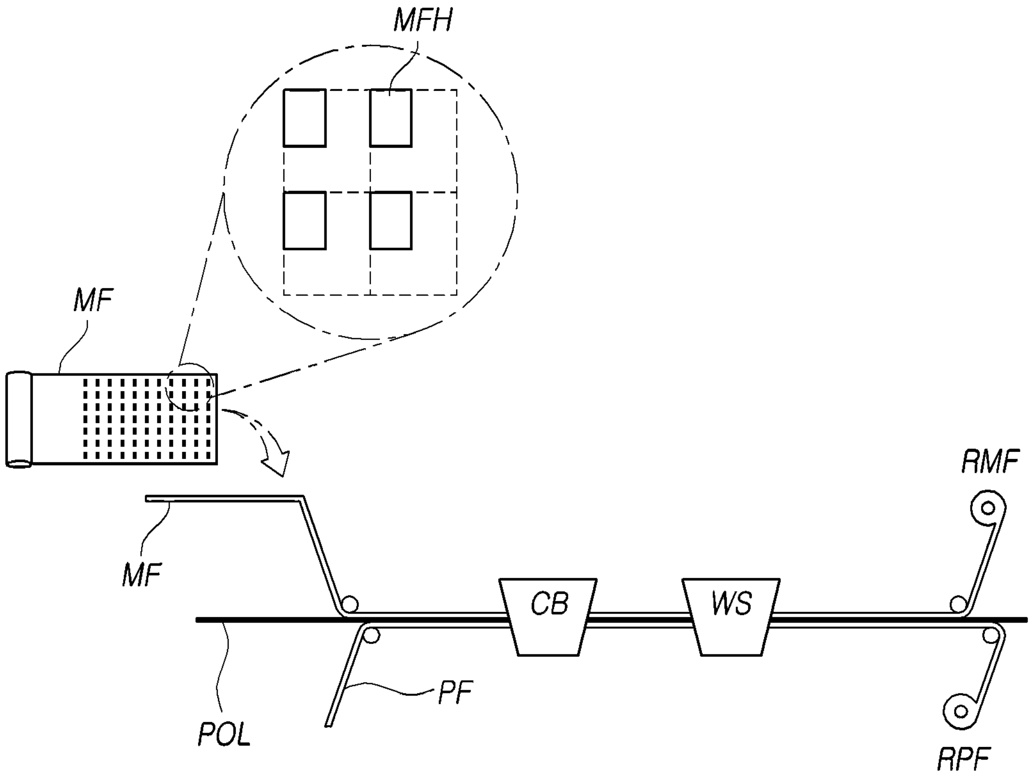
FIG. 13 is a diagram schematically illustrating a manufacturing process of a polarization layer in accordance with embodiments of the present disclosure.

FIG. 13 is a diagram schematically illustrating a manufacturing process of a polarization layer in accordance with embodiments of the present disclosure.

Referring to FIG. 13, a method for manufacturing a polarization layer includes providing a polyvinyl alcohol-based polarization member POL in which at least one of iodine and dichroic dye is oriented in a certain direction, a mask film MF which has mask film holes MFH and a temporary protective film PF, forming a film laminate by laminating the mask film MF, the polarization member POL and the temporary protective film PF, partially bleaching the film laminate by immersing the film laminate in a bleaching bath CB, washing and drying the partially bleached film laminate, and removing the mask film MF and the temporary protective film PF from the film laminate.

In the embodiments of the present disclosure, the polarization member POL includes a polyvinyl alcohol-based polarizer in which at least one of iodine and dichroic dye is oriented in a certain direction, and for example, can be a polyvinyl alcohol-based polarizer in which iodine and/or dichroic dye is oriented in a certain direction or a film laminate of the above-described polyvinyl alcohol-based polarizer and a transparent polymer film attached to one surface of the polarizer.

The polarization member POL can be formed of only a polyvinyl alcohol-based polarizer, or can further include a transparent polymer film on one surface of the polyvinyl alcohol-based polarizer. The polyvinyl alcohol-based polarizer can have a thickness of about 1 μm to 50 μm, for example, about 10 μm to 40 μm. When adding a transparent polymer film, the thickness of the transparent polymer film can be about 1 μm to 100 μm, for example, about 10 μm to 70 μm.

In the embodiments of the present disclosure, the polarization member POL can be used by being manufactured through a method for manufacturing a polyvinyl alcohol-based polarizer in which at least one of iodine and dichroic dye well known in the art is oriented in a certain direction or by purchasing a commercially available polyvinyl alcohol-based polarizer.

In the embodiments of the present disclosure, the mask film MF can have the mask film holes MFH to correspond to the shapes of areas to be bleached, for example, second areas as areas for increasing the single transmittance of the polarization layer.

The mask film holes MFH can be formed before providing the mask film MF.

As the mask film MF, an olefin-based film such as polyethylene (PE), polypropylene (PP) and polyethylene terephthalate (PET) or a vinyl acetate-based film such as ethylene vinyl acetate (EVA) and polyvinyl acetate can be used, but the mask film MF is not limited thereto. The thickness of the mask film MF can have about 50 μm to 200 μm, for example, about 80 μm to 150 μm.

Step of forming the mask film holes MFH in the mask film MF is not particularly limited, and can be performed through film punching methods well known in the art, for example, mold processing, knife processing or laser processing.

In the embodiments of the present disclosure, as the temporary protective film PF, an olefin-based film such as polyethylene, polypropylene and polyethylene terephthalate or a vinyl acetate-based film such as ethylene vinyl acetate and polyvinyl acetate can be used, but the temporary protective film PF is not limited thereto.

The step of forming the film laminate by laminating the mask film MF, the polarization member POL and the temporary protective film PF can be performed by film laminating methods well known in the art, for example, a method of attaching the mask film MF and the temporary protective film PF to the respective surfaces of the polarization member POL through gluing layers.

Without a limiting sense, the gluing layer can be formed by coating a gluing agent such as an acryl-based gluing agent, a silicone-based gluing agent, an epoxy-based gluing agent and a rubber-based gluing agent on the polarization member POL, the mask film MF or the temporary protective film PF. For example, when films having self-gluing strength (e.g., an EVA film, a PVAC film and a PP film) are used as the mask film MF and the temporary protective film PF, the mask film MF and the temporary protective film PF can be directly attached to the respective surfaces of the polarization member POL without forming gluing layers.

In the step of partially bleaching the film laminate by immersing the film laminate in the bleaching bath CB, by immersing the film laminate of the mask film MF/the polarization member POL/the temporary protective film PF in the bleaching bath CB, through an iodine dissociation reaction, the polarization member POL can be partially bleached where the mask film holes MFH are formed.

In the case of using the immersion process, unlike a coating process in which it is difficult to appropriately adjust a treatment time according to a situation due to a short treatment time, a treatment time can be appropriately adjusted when a temperature or a concentration is changed. Therefore, when the bleaching process is performed using the immersion process, it is easy to adjust a treatment time as the occasion demands.

A bleaching solution used in the bleaching bath CB is a solution which includes a bleaching agent capable of bleaching iodine and/or dichroic dye. The bleaching agent can be any bleaching agent capable of bleaching iodine and/or dichroic dye, and, for example, can be, but not limited to, at least one selected from the group consisting of sodium hydroxide (NaOH), sodium hydrosulfide (NaSH), sodium azide ($NaN_3$), potassium hydroxide (KOH), potassium hydrosulfide (KSH) and potassium thiosulfate ($KS_2O_3$).

The content of the bleaching agent in the bleaching solution can be about 0.1 weight % to 30 weight %, for example, 0.1 weight % to 15 weight %, 0.1 weight % to 10 weight % or 0.1 weight % to 5 weight %. When the content of the bleaching agent is less than 0.1 weight %, bleaching may not occur or a time required for bleaching can be prolonged to cause deformation of the polarization member POL due to swelling. When the content of the bleaching agent exceeds 30 weight %, an increase in bleaching efficiency is insignificant and thus economic efficiency degrades.

Water or a mixed solvent of water and alcohol can be used as a solvent for the bleaching solution, and methanol, ethanol, butanol, isopropyl alcohol or the like can be used alone or in combination as the alcohol.

The bleaching solution can be a strong basic solution with a pH of 11 to 14. This is because, when a strong base solution is used as the bleaching solution, the boric acid cross-link between polyvinyl alcohol and iodine and/or dichroic dye is destroyed so that the bleaching can be smoothly performed.

The step of partially bleaching the film laminate by immersing the film laminate in the bleaching bath CB can be performed for about 1 to 60 seconds, for example, 1 to 30 seconds or 1 to 15 seconds, in the bleaching solution of 10° C. to 70° C. When the temperature of the bleaching solution and the immersion time are out of the above numerical ranges, problems can arise in that swelling and irrigation occur in the polarizer due to the bleaching solution, causing curvature of the polarizer, or bleaching occurs even in an undesired area.

When the polarization member POL to which the mask film MF having the mask film holes MFH is laminated is immersed into the bleaching solution, the bleaching solution is in contact with the polyvinyl alcohol-based polarizer through the mask film holes MFH, and as a result, bleaching occurs in portions corresponding to the areas of the mask film holes MFH.

Figure 14A:
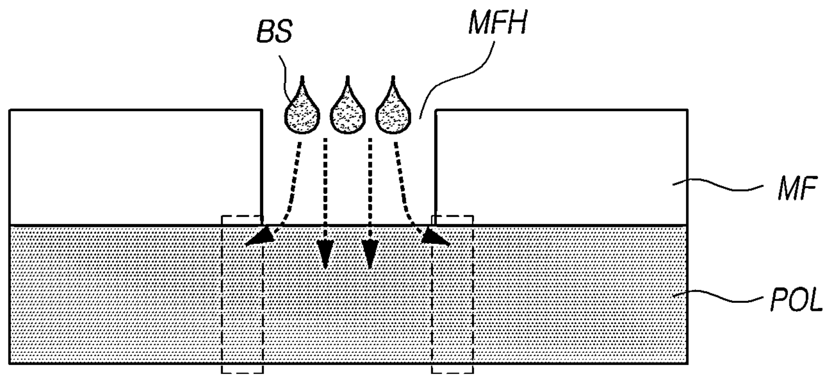
FIG. 14A is a diagram illustrating a partial bleaching of a polarization layer in accordance with embodiments of the present disclosure.
Figure 14B:
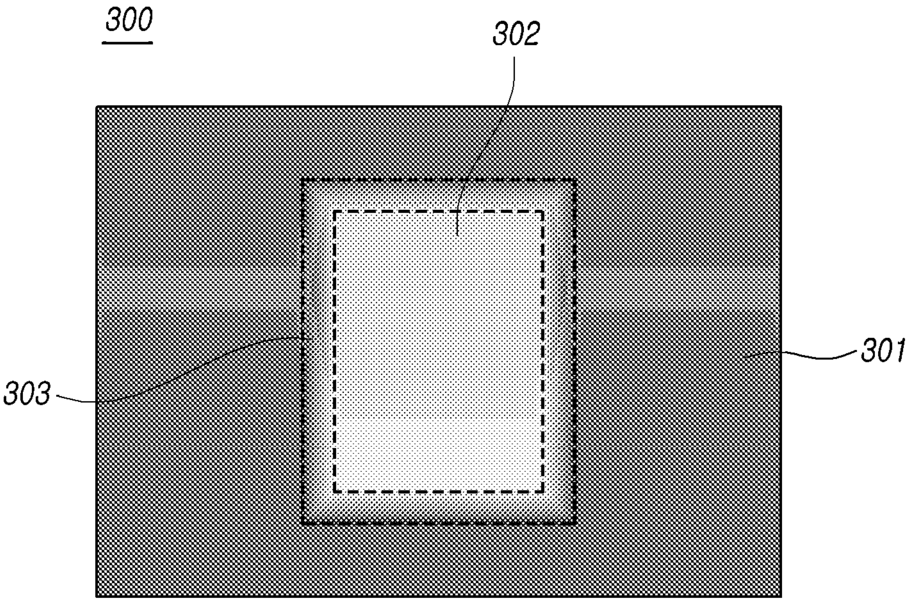
FIG. 14B is a plan view illustrating an example of the polarization layer manufactured by the manufacturing method of FIG. 14A.

FIG. 14A is a diagram illustrating partial bleaching of a polarization layer in accordance with embodiments of the present disclosure, and FIG. 14B is a plan view illustrating an example of the polarization layer manufactured by the manufacturing method of FIG. 14A.

Referring to FIG. 14A, a bleaching solution BS comes into contact with the polarization member POL through the mask film hole MFH, and bleaching occurs in a portion corresponding to the area of the mask film hole MFH. Therefore, an area corresponding to an area where the mask film MF is provided becomes a first area, and an area corresponding to the mask film hole MFH becomes a second area.

As a part of the bleaching solution BS partially penetrates in the direction of the mask film MF at the boundary area between the mask film MF and the mask film hole MFH, an area where partial bleaching occurs under the mask film MF at the boundary area is formed.

Referring to FIG. 14B, the first area 301 is an area in which the mask film MF is provided and bleaching does not occur, and the second area 302 is an area which corresponds to the mask film hole MFH and in which bleaching occurs to improve transmittance due to bleaching. Namely, the single transmittance of the second area 302 can be higher than the single transmittance of the first area 301. In embodiments of the present disclosure, the first area 301 can be referred to as a non-bleached area and the second area 302 can be referred to as a bleached area.

A third area 303 can be disposed between the first area 301 and the second area 302, for example, at the boundary area between the mask film MF and the mask film hole MFH. The third area 303 is an area which is formed as the bleaching solution partially penetrates in the direction of the mask film MF at the boundary area between the mask film MF and the mask film hole MFH. Therefore, the single transmittance of the third area 303 can be equal to or higher than the single transmittance of the first area 301 and can be lower than the single transmittance of the second area 302. The single transmittance of the third area 303 can gradually decrease from the single transmittance of the second area 302 to the single transmittance of the first area 301 in the direction from the second area 302 to the first area 301.

In the case where the third area 303 whose single transmittance gradually changes is disposed between the first area 301 and the second area 302, viewing angle transmittance can be improved at the boundary area.

Figure 15:
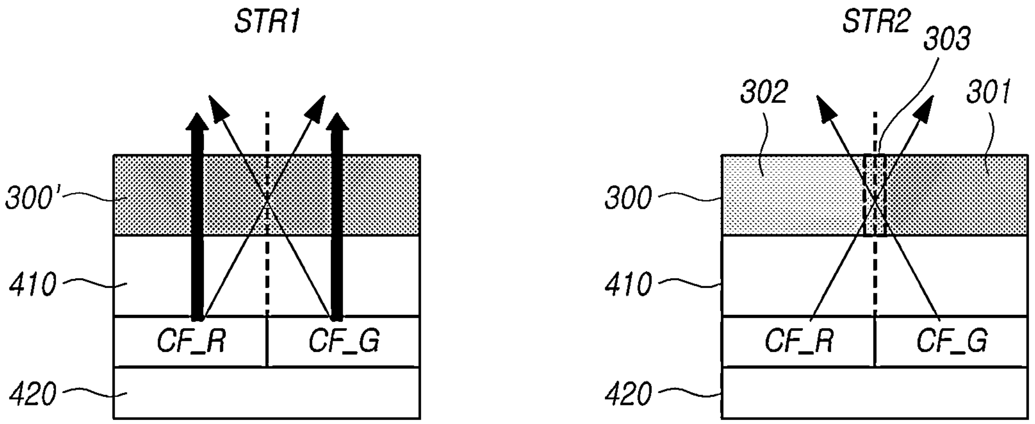
FIG. 15 is a diagram comparing viewing angle transmission of a conventional polarization layer and a polarization layer in accordance with embodiments of the present disclosure.

FIG. 15 is a diagram comparing viewing angle transmission of a conventional polarization layer and a polarization layer in accordance with embodiments of the present disclosure.

Referring to FIG. 15, the left side shows a first structure STR1 which is the structure of a conventional polarization layer, and the right side shows a second structure STR2 which is the structure of a polarization layer in accordance with the embodiments of the present disclosure.

In the first structure STR1, since red light and green light pass through a polarization layer 300' having the same single transmittance at the boundary between a red subpixel and a green subpixel, there is no change in viewing angle transmittance. However, in the second structure STR2, since the third area 303 included in the range of the single transmittances of the first area 301 and the second area 302 is disposed at the boundary between a red subpixel and a green subpixel, viewing angle transmittances for red light and green light can be improved.

Referring to FIG. 13, after the partial bleaching step is completed, the step of washing and drying the bleached film laminate can be performed.

This is because, when the bleaching solution remains on the polarization member, polarizer bleaching can occur in an undesired area during a later process due to the remaining bleaching solution. Washing can be performed in a method of immersing the film laminate in purified water or alcohol or dropping purified water or alcohol on the film laminate at a washing bath WS.

As the alcohol, for example, ethanol, methanol, propanol, butanol, isopropyl alcohol or a mixture thereof can be used.

After washing, the film laminate can be neutralized with an acidic solution, and neutralization can be performed in a method of immersing the film laminate in a neutralizing solution.

The neutralization solution can include at least one neutralizing agent selected from the group consisting of sulfuric acid, nitric acid, phosphoric acid, acetic acid, citric acid, hydrochloric acid, glutaric acid and succinic acid. The content of the neutralizing agent can vary depending on the type of the neutralizing agent, and can be about 0.001 weight % to 20 weight %, for example, about 0.003 weight % to 15 weight %. In the case of using acetic acid or citric acid, the content of the neutralizing agent can be about 0.01 weight % to 10 weight %. When the content of the neutralizing agent satisfies the above numerical ranges, process yield, quality of appearance of the polarization layer, optical properties, durability, and so forth are excellent.

After neutralizing the film laminate, in order to remove the neutralizing solution, the film laminate can be washed with purified water or alcohol.

After washing, drying step of drying the film laminate by passing the film laminate through a heating roll or an oven can be performed.

After drying the film laminate, the step of removing the mask film MF and the temporary protective film PF from the film laminate can be performed. The mask film MF and the temporary protective film PF can be removed through a mask film stripping roll RMF and a temporary protective film stripping roll RPF, respectively.

By the above-described manufacturing method, it is possible to manufacture a polarization layer applied to a display device capable of minimizing an increase in reflectance of the display device and improving light transmission efficiency.

By the above-described manufacturing method, it is possible to manufacture a polarization layer applied to a display device capable of reducing power consumption and improving the lifespan of a light emitting element.

By the above-described manufacturing method, it is possible to manufacture a polarization layer applied to a display device capable of low power consumption.

Figure 16:
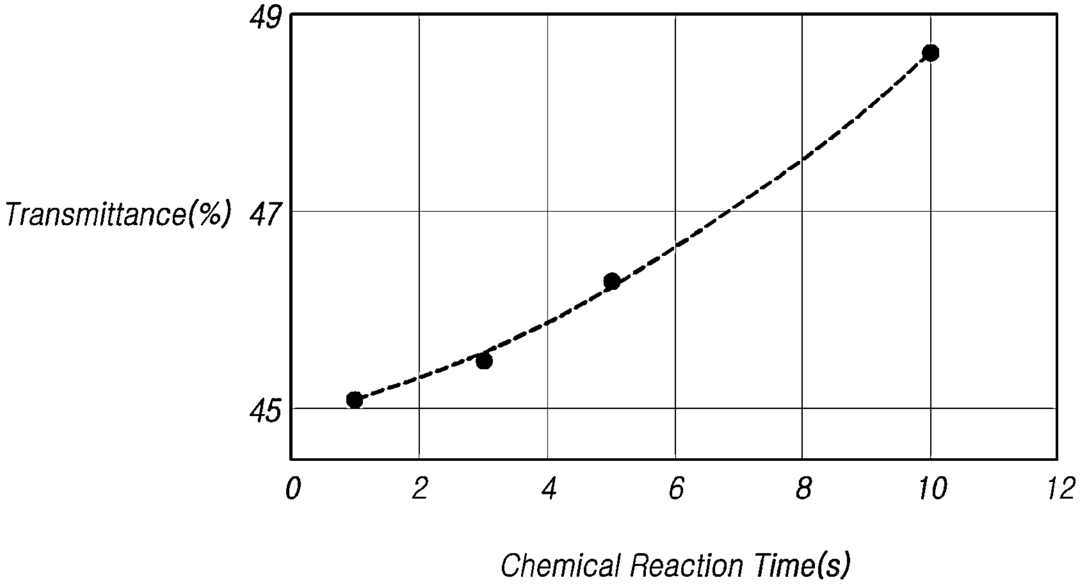
FIG. 16 is a graph showing single transmittance according to a bleaching reaction time of a polarization layer in accordance with embodiments of the present disclosure.

FIG. 16 is a graph showing single transmittance according to a bleaching reaction time of a polarization layer in accordance with embodiments of the present disclosure. A PVA-based film was used as a polarization member, a 100 μm PET film was used as a mask film, and a 1.5 weight % KOH aqueous solution was used as a bleaching solution. It can be seen that, when the polarization member reacts with the bleaching solution for 9 seconds, the transmittance of the polarization layer increases from 45% to 48% in the area of a mask film hole.

Results for the reflectances and maximum currents of a conventional polarization layer, a polarization layer with increased transmittance and a polarization layer according to the embodiments of the present disclosure manufactured according to FIG. 16 are shown in Table 1 and Table 2 below, and the reflectances and maximum currents were measured on the basis of a panel reflectance of 40%.

Comparative Example 1 is a conventional polarization layer whose single transmittance is 45.5%, Comparative Example 2 is a PVA-based polarization layer whose single transmittance is 48%, and, in Embodiment 1, as shown in FIG. 5, the emission areas of the first and second subpixels SP1 and SP2 are a second area whose single transmittance is 48% and an area other than the second area is a first area whose single transmittance is 45.5%. In FIG. 5, the first subpixel SP1 is a blue (B) subpixel which emits blue light, the second subpixel SP2 is a red (R) subpixel which emits red light, a third subpixel SP3 is a green (G) subpixel which emits green light, and the fourth subpixel SP4 is a white (W) subpixel which emits white light.

TABLE 1

| Reflectance | Comparative Example 1 | Comparative Example 2 | Embodiment 1 |
|---|---|---|---|
| Product | 1.2% | 2.0% | 1.27% |
| Inside | 0.3% | 1.1% | 0.37% |
| Emission area of SP1(B) | 0.01% | 0.03% | 0.03% |
| Emission area of SP2(R) | 0.02% | 0.06% | 0.06% |
| Emission area of SP3(G) | 0.01% | 0.02% | 0.01% |
| Emission area of SP3(W) | 0.06% | 0.21% | 0.06% |
| Non-emission area(NEA) | 0.21% | 0.77% | 0.21% |
| Outside | 0.9% | 0.9% | 0.9% |

Referring to Table 1, it can be seen that, in Comparative Example 2 whose single transmittance is 48%, the reflectance of the inside and reflectances in the emission areas and non-emission areas of respective subpixels increase compared to Comparative Example 1 whose single transmittance is 45.5% and the reflectance of an entire product increases from 1.2% to 2%. On the other hand, it can be seen that, in Embodiment 1 in which the emission areas of the first and second subpixels SP1 and SP2 are the second area whose single transmittance is 48% and an area other than the second area includes the first area whose single transmittance is 45.5%, the reflectance of the inside and reflectances in the emission areas and non-emission areas of respective subpixels are the same or minimally increase compared to Comparative Example 1 whose single transmittance is 45.5% and the reflectance of an entire product minimally increases from 1.2% to 1.27%.

TABLE 2

| Maximum Current [A](%) | Comparative Example 1 | Embodiment 1 |
|---|---|---|
| SP1(B) | 6.40 (100%) | 6.07 (94.8%) |
| SP2(R) | 9.01 (100%) | 8.54 (94.8%) |
| SP3(G) | 7.92 (100%) | 7.92 (100%) |

Referring to Table 2, it can be seen that, in Embodiment 1 in which the emission areas of the first and second subpixels SP1 and SP2 are the second area whose single transmittance is 48% and an area other than the second area includes the first area whose single transmittance is 45.5%, maximum currents provided to the first and second subpixels SP1 and SP2 decrease to 94.8% compared to Comparative Example 1.

Referring to Tables 1 and 2, in the display device in accordance with the embodiments of the present disclosure, by disposing different single transmittances for subpixels in a polarization layer, it is possible to minimize an increase in reflectance of the display device and increase light transmission efficiency.

In the display device in accordance with the embodiments of the present disclosure, by disposing different single transmittances for subpixels in a polarization layer, it is possible to reduce power consumption and improve the lifespan of a light emitting element.

In the display device in accordance with the embodiments of the present disclosure, by disposing different single transmittances for subpixels in a polarization layer, it is possible to provide the display device capable of low power consumption.

A brief description of the embodiments of the present disclosure described above is as follows.

Embodiments of the present disclosure can provide a display device including a substrate on which a plurality of subpixels each including an emission area and a non-emission area are disposed, a polarization layer disposed on the substrate and including a first area and a second area having different single transmittances, and an organic light emitting element disposed in the emission area, wherein a single transmittance of the second area is higher than a single transmittance of the first area.

The polarization layer can have a single transmittance of 40% to 50%, and a single transmittance of the second area can be higher by 0.1% or more than a single transmittance of the first area.

The polarization layer can include a third area between the first area and the second area, and a single transmittance of the third area can be equal to or higher than a single transmittance of the first area and can be equal to or lower than a single transmittance of the second area.

A single transmittance of the third area can decrease from a single transmittance of the second area to a single transmittance of the first area in a direction from the second area to the first area.

The second area can be positioned in an area which overlaps with the organic light emitting element.

The display device can further include a color filter layer between the polarization layer and the organic light emitting element, wherein the second area can be positioned in an area which overlaps with the color filter layer.

The embodiments of the present disclosure can provide the display device including the plurality of subpixels including a first subpixel, a second subpixel and a third subpixel which express different colors, wherein the second area is positioned in an emission area of the first subpixel, and wherein the first area is positioned in an area other than the second area.

The second area can be further positioned in an emission area of the second subpixel or an emission area of the third subpixel.

The second area can be further positioned in an emission area of the second subpixel and an emission area of the third subpixel.

In the embodiments of the present disclosure, the plurality of subpixels can further include a fourth subpixel which expresses a different color from the first to third subpixels.

The second area can be further positioned in at least one emission area among an emission area of the second subpixel, an emission area of the third subpixel and an emission area of the fourth subpixel.

The second area can be further positioned in at least two emission areas among an emission area of the second subpixel, an emission area of the third subpixel and an emission area of the fourth subpixel.

The second area can be further positioned in an emission area of the second subpixel, an emission area of the third subpixel and an emission area of the fourth subpixel.

The second area can extend from the non-emission area to the emission area of at least one of the plurality of subpixels.

The second area at least partially can overlap the emission area of at least one of the plurality of subpixels.

The second area entirely can overlap the emission area of the at least one of the plurality of subpixels.

A shape of the second area and a shape of the emission area of at least one of the plurality of subpixels can be the same.

The display device can further comprise a bank to define the emission area of at least one of the plurality subpixel, wherein the second area can overlap the bank.

Embodiments of the present disclosure can provide a display device including a substrate having a plurality of subpixels, each subpixel including an emission area and a non-emission area, a polarization layer disposed on the substrate, and including a non-bleached area and a bleached area having different single transmittances and an organic light emitting element disposed in the emission area, wherein the bleach area of the polarization layer at least partially can overlap the emission area of at least one of the plurality of subpixels and can not overlap the non-emission area of the at least one of the plurality of subpixels.

The single transmittance of the bleached area can be higher by at least about 0.1% than the single transmittance of the non-bleached area.

According to the embodiments of the present disclosure, it is possible to provide a display device which minimizes an increase in reflectance of the display device and increases light transmission efficiency.

According to the embodiments of the present disclosure, by disposing different single transmittances for subpixels in a polarization layer of a display device, it is possible to provide a display device which minimizes an increase in reflectance of the display device and increases light transmission efficiency.

According to the embodiments of the present disclosure, by disposing different single transmittances for subpixels in a polarization layer of a display device, it is possible to provide a display device capable of reducing power consumption and improving the lifespan of a light emitting element.

According to the embodiments of the present disclosure, by disposing different single transmittances for subpixels in a polarization layer of a display device, it is possible to provide a display device capable of low power consumption.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present disclosure. The above description and the accompanying drawings provide an example of the technical idea of the present disclosure for illustrative purposes only. For example, the disclosed embodiments are intended to illustrate the scope of the technical idea of the present disclosure.

What is claimed is:

1. A display device comprising:

a substrate having a plurality of subpixels, each subpixel including an emission area and a non-emission area;

a polarization layer disposed on the substrate, and including a first area and a second area having single transmittances; and an organic light emitting element disposed in the emission area, wherein a single transmittance of the second area is higher than a single transmittance of the first area from among the single transmittances, and wherein the second area is positioned in an area of the polarization layer which overlaps with the organic light emitting element.

2. The display device of claim 1, wherein:

the polarization layer has a single transmittance of about 40% to 50%, and the single transmittance of the second area is higher by about 0.1% or more than the single transmittance of the first area.

3. The display device of claim 1, wherein:

the polarization layer includes a third area between the first area and the second area, and a single transmittance of the third area is equal to or higher than the single transmittance of the first area and is equal to or lower than the single transmittance of the second area.

4. The display device of claim 3, wherein the single transmittance of the third area decreases from that of the single transmittance of the second area to that of the single transmittance of the first area in a direction from the second area to the first area.

5. The display device of claim 1, further comprising:

a color filter layer between the polarization layer and the organic light emitting element, wherein the second area is positioned in an area of the polarization layer which overlaps with the color filter layer.

6. The display device of claim 1, wherein:

the plurality of subpixels include a first subpixel, a second subpixel and a third subpixel of different colors, the second area is positioned in the emission area of the first subpixel, and the first area is positioned in an area of the polarization layer other than the second area.

7. The display device of claim 6, wherein the second area is further positioned in the emission area of the second subpixel or the emission area of the third subpixel.

8. The display device of claim 6, wherein the second area is further positioned in the emission area of the second subpixel and the emission area of the third subpixel.

9. The display device of claim 7, wherein the plurality of subpixels further include a fourth subpixel of a different color from those of the first to third subpixels.

10. The display device of claim 9, wherein the second area is further positioned in at least one emission area among the emission area of the second subpixel, the emission area of the third subpixel and the emission area of the fourth subpixel.

11. The display device of claim 9, wherein the second area is further positioned in at least two emission areas among the emission area of the second subpixel, the emission area of the third subpixel and the emission area of the fourth subpixel.

12. The display device of claim 9, wherein the second area is further positioned in the emission area of the second subpixel, the emission area of the third subpixel and the emission area of the fourth subpixel.

13. The display device of claim 1, wherein the second area extends from the non-emission area to the emission area of at least one of the plurality of subpixels.

14. The display device of claim 1, wherein the second area at least partially overlaps the emission area of at least one of the plurality of subpixels.

15. The display device of claim 14, wherein the second area entirely overlaps the emission area of the at least one of the plurality of subpixels.

16. The display device of claim 1, wherein a shape of the second area and a shape of the emission area of at least one of the plurality of subpixels is the same.

17. The display device of claim 1, further comprising a bank to define the emission area of at least one of the plurality subpixels, wherein the second area overlaps the bank.

18. A display device comprising:

a substrate having a plurality of subpixels, each subpixel including an emission area and a non-emission area;

a polarization layer disposed on the substrate, and including a non-bleached area and a bleached area having different single transmittances; and an organic light emitting element disposed in the emission area, wherein the bleach area of the polarization layer at least partially overlaps the emission area of at least one of the plurality of subpixels and does not overlap the non-emission area of the at least one of the plurality of subpixels.

19. The display device of claim 18, wherein the single transmittance of the bleached area is higher by at least about 0.1% than the single transmittance of the non-bleached area.

* * * * *